United States Patent
Ainsbury et al.

[11] Patent Number: 5,528,459
[45] Date of Patent: Jun. 18, 1996

[54] TANDEM CIRCUIT CARDS

[75] Inventors: Alan W. Ainsbury, Pickering; Albert J. Kerklaan, Milton, both of Canada

[73] Assignee: International Business Machines Corporation, Armonk, N.Y.

[21] Appl. No.: 520,844

[22] Filed: Aug. 28, 1995

Related U.S. Application Data

[62] Division of Ser. No. 152,786, Nov. 15, 1993.

[30] Foreign Application Priority Data

Nov. 16, 1992 [CA] Canada .................. 2083017

[51] Int. Cl.⁶ .................................................. H04K 1/14
[52] U.S. Cl. .................. 361/737; 361/752; 361/796; 257/679
[58] Field of Search ..................... 361/736, 737, 361/752, 796, 728; 257/679; 364/708, 709; 174/253, 261; 235/492; 439/60, 59, 65, 64, 924

[56] References Cited

U.S. PATENT DOCUMENTS

| D. 320,018 | 9/1991 | Bakanowsky, III | 273/148 B |
|---|---|---|---|
| 4,179,178 | 12/1979 | Bachman et al. | |
| 4,386,388 | 5/1983 | Beun . | |
| 4,798,946 | 1/1989 | Fujii et al. . | |
| 4,844,465 | 7/1989 | Hibino et al. | 273/148 B |
| 4,857,005 | 8/1989 | Kikuchi et al. | 439/140 |
| 4,858,070 | 8/1989 | Buron et al. | 361/736 |
| 4,868,714 | 9/1989 | Banjo et al. | 361/737 |
| 4,887,188 | 5/1992 | Howe . | |
| 4,924,076 | 5/1990 | Kitamura . | |
| 4,941,841 | 7/1990 | Darden et al. | 439/377 |
| 5,047,894 | 9/1991 | Tanuma et al. | 361/737 |
| 5,112,051 | 5/1992 | Darling et al. | 273/435 |
| 5,113,317 | 5/1992 | Howe . | |
| 5,155,663 | 10/1992 | Harase | 361/737 |
| 5,193,052 | 3/1993 | Larson et al. | 361/737 |
| 5,196,994 | 3/1993 | Tanuma et al. | 361/395 |
| 5,225,968 | 7/1993 | Ma | 361/737 |
| 5,282,621 | 2/1994 | Tseng | 273/148 B |

FOREIGN PATENT DOCUMENTS

| 2057518 | 6/1993 | Canada | H05K 1/00 |
|---|---|---|---|
| 1175091 | 7/1989 | Japan | 361/737 |

*Primary Examiner*—Leo P. Picard
*Assistant Examiner*—Y. Whang
*Attorney, Agent, or Firm*—Anthony N. Magistrale

[57] ABSTRACT

An extension module for tandem connection to a base circuit card having an external sheet material jacket girding the card. The module includes a module housing and a pair of spaced apart parallel support fingers extending from the housing. The outer sides of the support fingers are configured for slidable insertion into corresponding spaced apertures in the rearward end of the base circuit card to engage inner surfaces of the jacket adjacent opposite side edges of the jacket of the card. An electrical connector is located between the support fingers and is adapted for mating connection with a corresponding electrical connector located at the rearward end of the base circuit card, when the extension module is connected to the base circuit card. When the extension module is connected to the base circuit card by substantially full insertion of the support fingers into the base circuit card the engagement of the jacket embracing the fingers rigidly joins the extension module to the base card to form an integral extended circuit card.

1 Claim, 7 Drawing Sheets

TANDEM CIRCUIT CARDS

This is a divisional of a Ser. No. 08/152,786 filed on Nov. 15, 1993.

FIELD OF THE INVENTION

This invention relates generally to the mechanical design of removable or portable circuit cards which are designed for both compactness and the protection of the internal components of the circuit cards.

BACKGROUND OF THE INVENTION

In the electronic industry electronic circuits have become more and more compact to the point that cartridges such as small portable circuit cards have been developed that can be removably inserted into electronic equipment typically for temporary use. In particular, external circuit cards have been developed which approximate the size of credit cards, though somewhat thicker, and which incorporate a circuit board sandwiched between metal or plastic covers, and an electrical connector for connection to external electronic equipment. International standards known as the Personal Computer Memory Card International Association (PCMCIA) standards were established to encourage uniformity among different manufacturers in the field of small circuit cards.

Cartridges enclosing storage devices for programs such as games have been in use for many years particularly for video games and some microcomputers. Because of their relatively large size physical durability was not a property that was difficult to develop for cartridges. Space was available to build the necessary strength into the components and housings. However, for a circuit card package the size of a credit card physical construction techniques are more limited.

Memory card devices are illustrated in U.S. Pat. No. 4,924,076, issued May 8, 1990 and assigned to Mitsubishi Denki Kabusihiki Kaisha, Japan. The devices illustrated incorporate semiconductor devices mounted in an internal base and enclosed in a plastic package formed from two bonded plastic sections.

Another reference, U.S. Pat. No. 4,798,946, issued Jan. 17, 1989, and assigned to the assignee of the previous mentioned patent describes a plastic package for containing an IC card, which essentially constructs a plastic box from halves glued along mating edges.

The applicant has not found any references to circuit cards or cartridges produced by others that would meet the specifications outlined by the Personal Computer Memory Card International Association (PCMCIA), in September 1991, relating to torque, bend, flex and warpage of credit card sized memory cards. Plastic components do not generally provide sufficient electrical shielding to protect internal electronic components from static electricity, while adhesives used to bond them may fail under stress from heat, humidity and other factors.

Similarly, designs known to the applicant incorporating electronic cards retained by plastic perimeter frames and sandwiched between planar plastic or metal sheets bonded to the frame have not been able to meet the PCMCIA specifications.

U.S. Pat. No. 4,386,388 issued May 31, 1983 and assigned to Northern Telecom Limited describes a printed circuit board assembly which uses a sheet aluminum cover which loosely encloses a circuit board; abutting edges of the cover are held in a contiguous relationship by inturned edges of the cover which engage small notches in end plates on the circuit board. While this assembly may be satisfactory for larger circuit boards, sufficient strength or stiffness is not likely possible for circuit boards approaching the size of credit cards.

Realizing the deficiencies of the prior art known to the applicant herein, a compact circuit card assembly was developed which became the subject matter of Canadian Patent Application 2057518 filed on Dec. 9, 1991. This assembly is convenient from a manufacturing perspective and is physically durable even if constructed in a small size satisfying the PCMCIA standards.

A preferred form of the circuit card included an internal circuit module which included a circuit component assembly and an electrical connector attached to the component assembly. A protective metal covering of thin stainless steel closely girded and substantially enclosed the module in a one piece substantially rigid jacket, while an opening was provided in the jacket to expose an electrical connector so the card could be connected to external equipment such as a computer. The circuit module was constructed with a perimeter frame of plastic, Which carried a circuit board, electronic components, and an electrical connector. Recesses were provided in the frame for locating the metal covering on the frame while projecting edges or corners of the frame provide concealment for jacket edges and provided impact absorbing corners for the card. No adhesives were necessary to bond the jacket to the frame or other components of the card. Memory cards constructed as described were found to able to satisfy the PCMCIA standards version 1 and 2 and were quite durable.

Credit card sized circuit cards described under the PCMCIA standard version 1 have found substantial acceptance in the electronic industry, but were found wanting in some instances in terms of physical space for components and adaptability to perform additional functions that are desirable. Accordingly PCMCIA standard version 2 was adopted which provided for slightly thicker cards and the option of extending the length of the card to add a rear section that can be considerably thicker than the front portion of the card. Although substantially all of the front portion of the card could be inserted into an electronic device such as a computer for use the rear portion can be quite bulbous and is not conveniently housed within the electronic device with which it is intended to be used. Accordingly when an extended card is in use the rear portion of the card is exposed to possible stresses or damage while in use, (unlike the nonextended version) so it is important that the entire card is strongly constructed, preferably in a unitary structure.

While it is possible to manufacture a circuit card satisfying the PCMCIA standard version 2 in a single unit; this would require a completely new and different assembly line than required for a version 1 or 2 non-extended card. Accordingly it appears useful to construct an extended card in two sections that can be joined together in tandem to produce the final extended card. The front or base portion of the card could be made on an assembly line designed to handle the non-extended cards, and the extensions could be assembled on an additional assembly line or contracted to a vendor. In addition the base portion could be designed to provide basic electronic and memory functions while the extensions could be designed for specific functions such as LAN communications, infrared communications, audio functions, etc., to work with and complement the functions provided by the base. In this manner customized extended card assemblies could be produced without the necessity of constructing a different full extended card for each function. One base card could be used with any one of a number of extension cards.

Electrical and mechanical connection of circuit cards is known in the literature; however because of the small size of the circuit cards conforming to the PCMCIA standards the applicant was not able to find any connection means capable of providing secure mechanical and electrical connection between components of the card system while providing a rugged supporting connection between base and extension components.

U.S. Pat. No. 5,113,317 issued May 12, 1992 to Allen-Bradley Company describes a piggy-back support for an auxiliary circuit card so that one card may be inserted along rails contained on one side of a host card to provide support for the auxiliary card. This reference does not appear useful in the PCMCIA circuit card field because of the extra thickness required by the piggy-back configuration.

U.S. Pat. No. 4,941,841 issued Jul. 17, 1990 to Julius Darden et al describes an adapter and removable slide-in cartridge for an information storage system. The apparatus disclosed in this reference forms a fairly bulky system compared to the size range required in the PCMCIA circuit card field.

U.S. Pat. No. 4,179,178 issued Dec. 18, 1979 to RCA Corporation describes a plug in circuit cartridge with electrostatic charge protection which uses a pair of actuator pins which extend beyond an electrical connector to engage corresponding apertures in a mating assembly to contact a shield device on the mating assembly to raise the shield to permit engagement of the electrical connector. There is no disclosure of the connection of one cartridge to another. The apparatus disclosed is designed to connect a portable cartridge such as a video game cartridge to an electronic device such as a player capable of using it.

SUMMARY OF THE INVENTION

It has been found that the invention herein overcomes the deficiencies of the prior art while providing a compact tandem circuit card assembly which is convenient from a manufacturing perspective and which is physically durable even if constructed in accordance with PCMCIA standards.

An extension module is provided by one embodiment of the present invention for tandem connection to a base circuit card. The extension module includes a module housing, a pair of spaced apart parallel rigid support fingers extending from the housing, the support fingers being configured for sliding insertion into corresponding parallel sockets in the base circuit card. An electrical connector located between said support fingers is adapted for mating connection with a corresponding electrical connector located at the rearward end of the base circuit card when the extension module is connected to the base circuit card. When the extension module is connected to the base circuit card by substantially full insertion of the support fingers into the base circuit card sockets the engagement of said sockets with the fingers rigidly joins the extension module to the base card to form an integral extended circuit card.

DETAILED DESCRIPTION OF THE PREFERRED EMBODIMENT

Figure 1A:
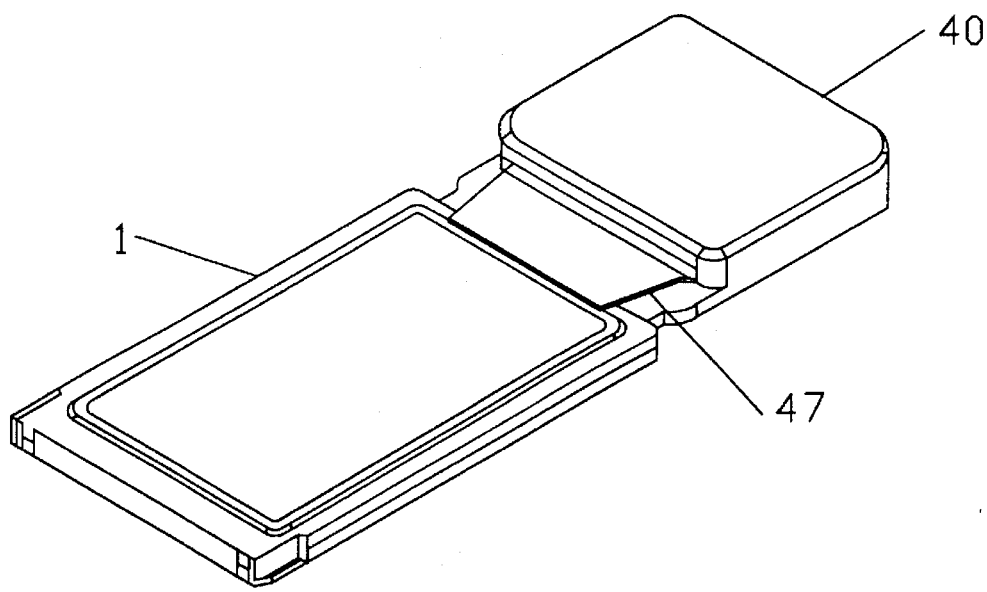
FIG. 1 composed of FIGS. 1a and 1b provides perspective views of an assembled extended card.

A preferred embodiment of the invention is incorporated into a rectangular base circuit card and extension module which are depicted in the drawings.

The base module will be described in detail first, followed by the extension module, and lastly a description of how they are used together.

Figure 1B:
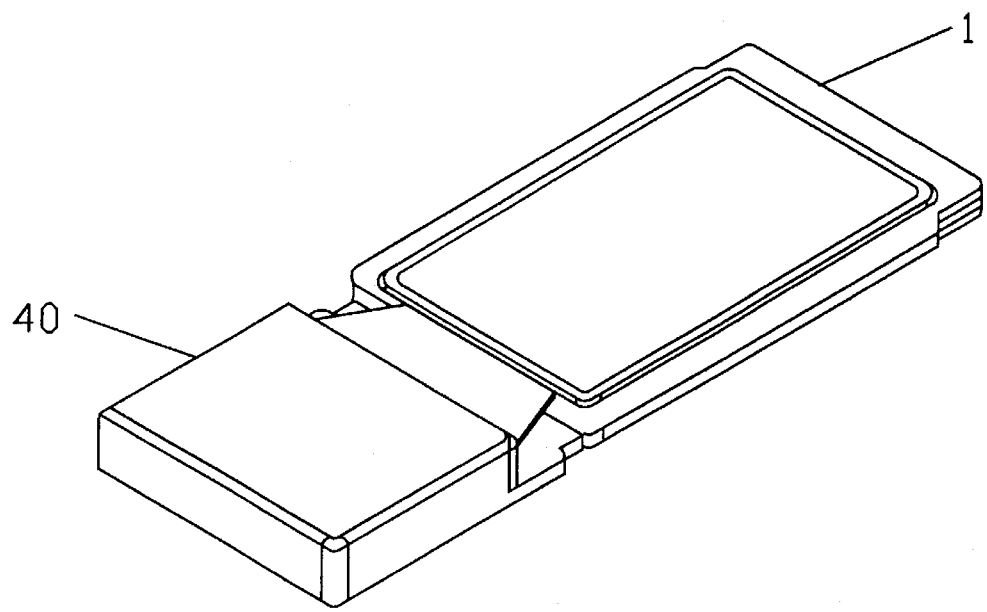

Referring to FIG. 1, base card 1 is approximately the size of a credit card although somewhat thicker, the length and width being 85.6 mm. and 54.0 mm. respectively, with a thickness of approximately 5.0 mm. conforming to the size specifications outlined by the Personal Computer Memory Card International Association (PCMCIA) for PC memory cards in the September 1991, issue PCMCIA PC Card Standard Release 2.0, which is available from the association. The base card 1 when assembled with extension module 40 meets the PCMCIA standards specified for extended cards These cards are designed to be used in personal computers or other devices with suitable sockets as an alternative to disk drives, floppy disks, interfaces, communications or other devices.

The difficulties with designing cards in this size include the meeting of the PCMCIA requirements for resistance to integrity, torque, bending, flexing and warpage to ensure longevity and reliability, requirements for protection from impact damage, and damage from static electricity.

The embodiment of the invention described herein satisfies these requirements.

Figure 2A:
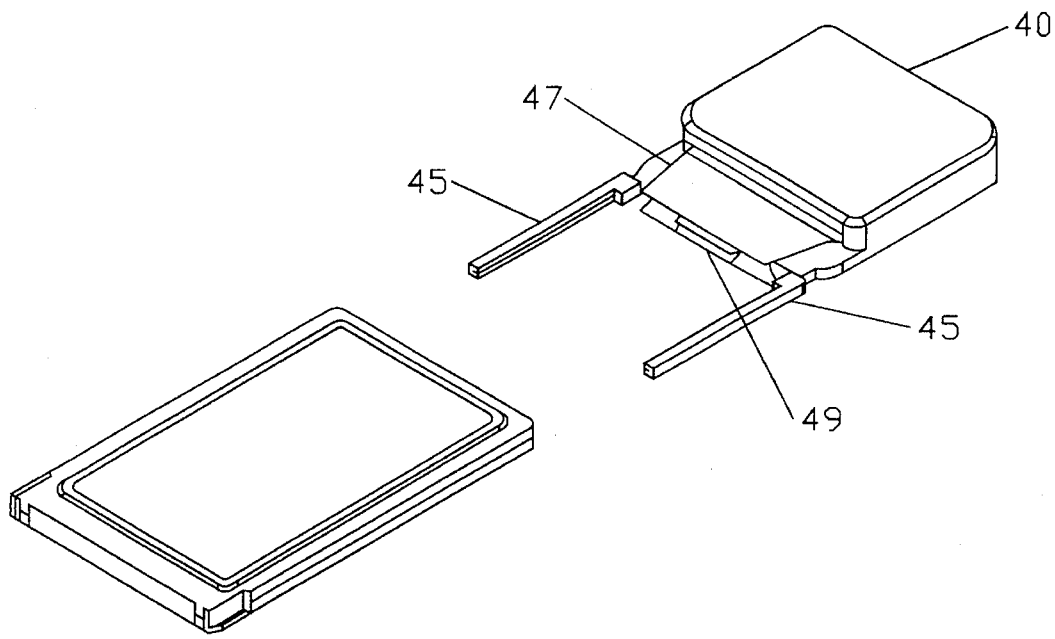
FIG. 2 composed of FIGS. 2a, 2b, 2c provides perspective view of the separated sections of an extended card.
Figure 2B:
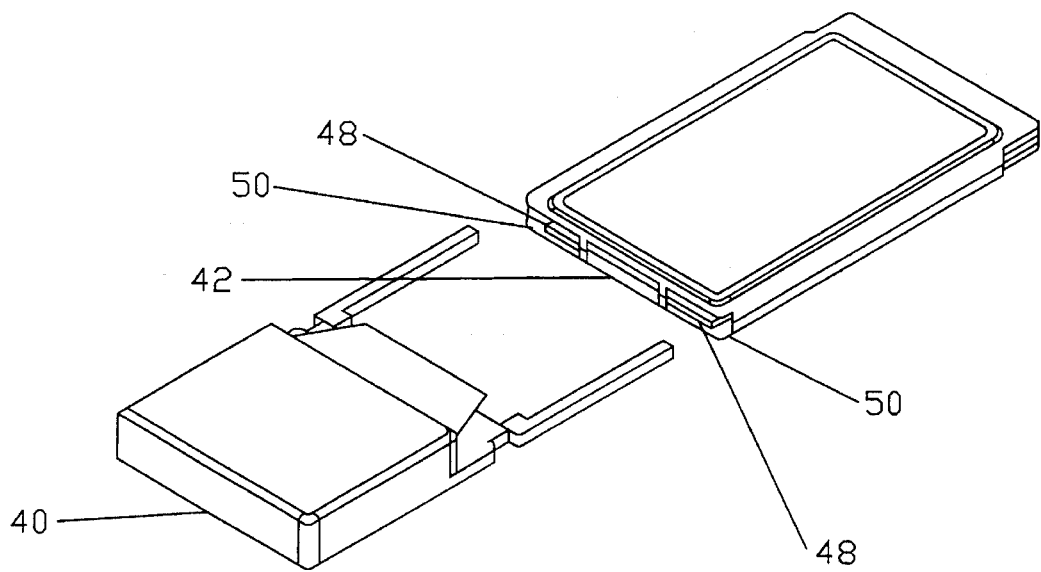
Figure 2C:
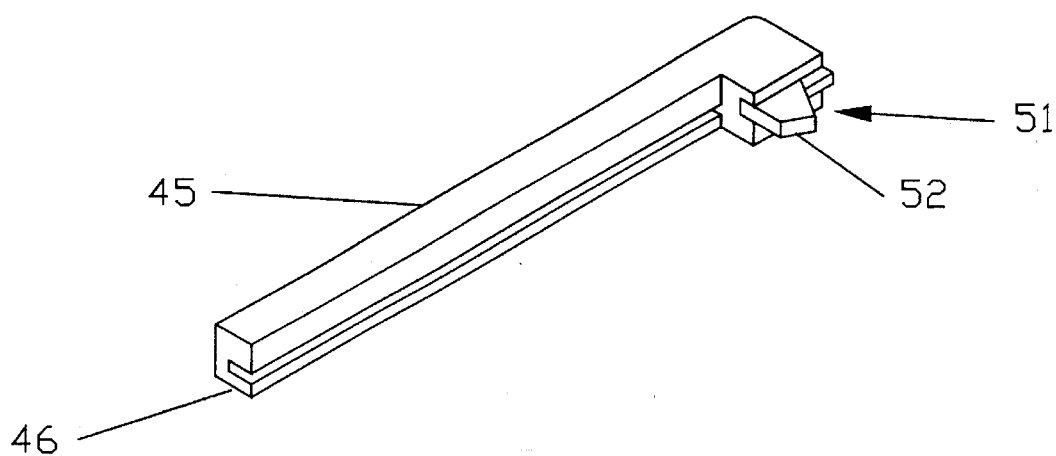
Figure 3:
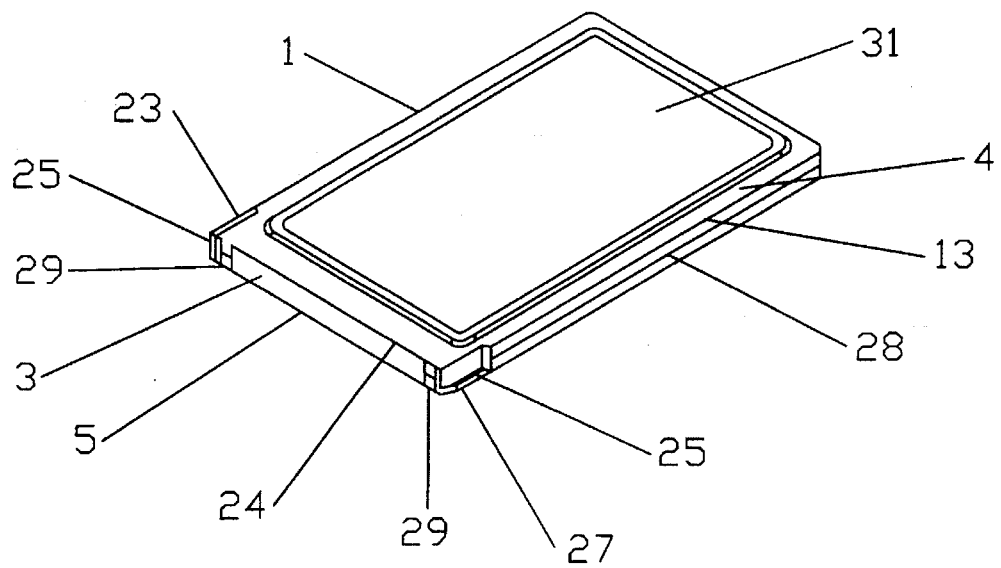
FIG. 3 is a perspective view of an assembled base card.

Referring to FIG. 2 and FIG. 3, base card 1 is comprised of a circuit module 2 which includes integrated circuits or electronic components (not shown) and a first electrical connector 3 connected to the electronic components. A protective metal covering, in this case of 304L stainless steel sheeting 0.2 mm. thick, closely girds and substantially encloses the module 2 in a close fitting one-piece substantially rigid jacket 4, having a top surface 31, bottom surface (not shown) and vertical sidewalls 13.

In the embodiment shown jacket 4 includes an opening 5 at the front of the card which exposes part of the first electrical connector 3 so that the card 1 can be connected by means of a suitable socket to a personal computer or other external equipment. A similar opening is provided at the rear of the card for exposing rear electrical connector 42 which is used for electrical connection to electrical connector 49 of the extension module 40.

Jacket 4 provides substantial protection for internal components of module 2 from physical damage and also provides electrical shielding of any sensitive internal components from external static electricity.

Physical protection of the circuit module 2 is achieved from the resistance of the metal jacket 4 to external penetration and from the rigidity of the jacket, which when constructed in rectangular configuration as shown, essentially forms a flattened hollow beam, ie. a boxbeam which resists bending, flexing and twisting of the card 1 and circuit module 2 more effectively than other means known to the applicant.

Figure 4A:
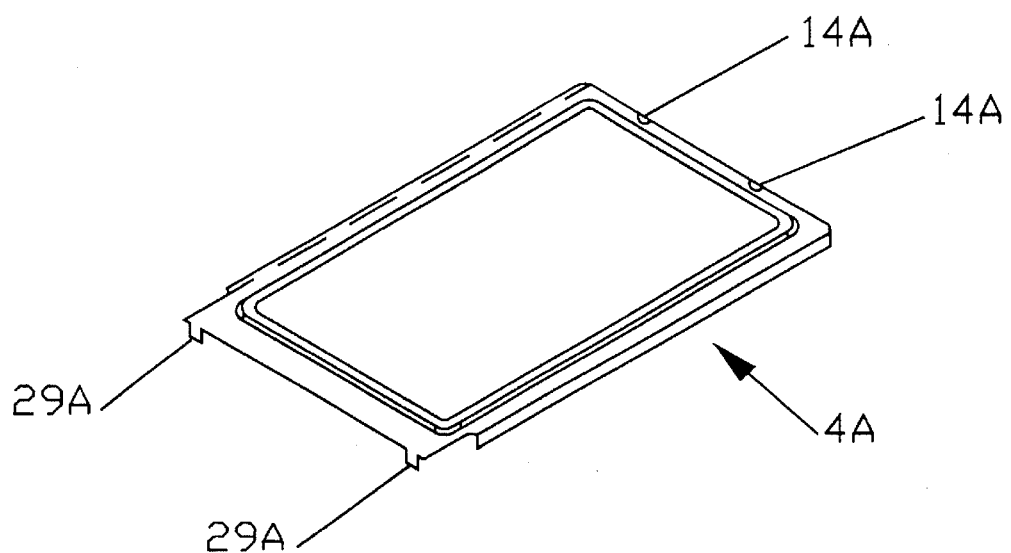
FIG. 4, composed of FIGS. 4a, 4b, and 4c provides perspective views of the major parts of the base card.
Figure 4B:
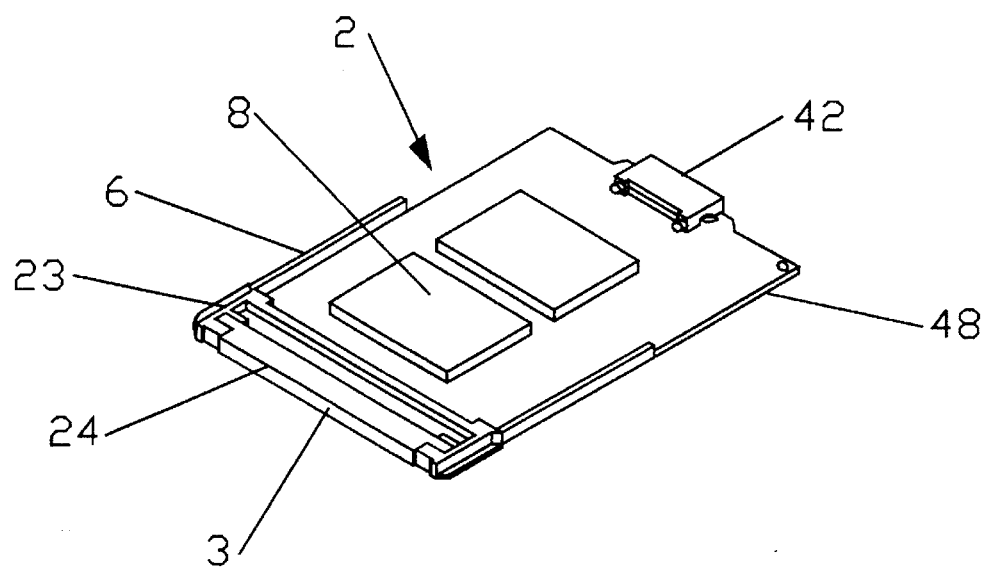
Figure 4C:
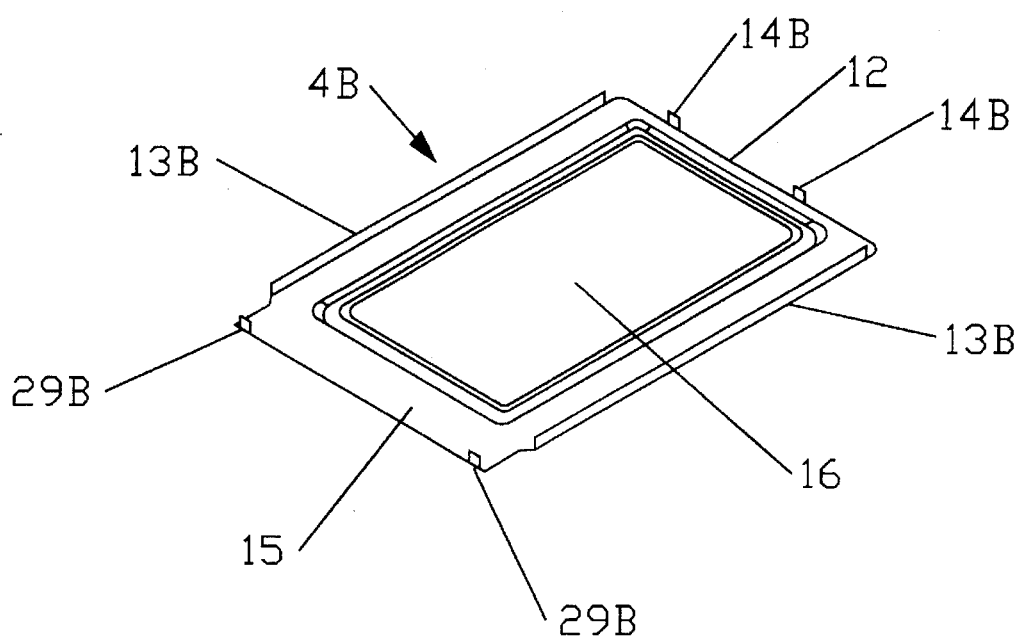

Referring to FIG. 4, component details of one embodiment of a circuit card are shown. Circuit module 2 is composed of a partial perimeter frame 6, which advantageously may be constructed of a suitable plastic such as glass filled polycarbonate, eg. LEXAN 500™ (LEXAN 500 is a trade mark of General Electric), which carries a circuit board 7 and electrical connector 3. As may be seen the perimeter frame extends only partially along the edges of the circuit board, leaving the rear portion 48 of the side edges unsupported and exposed internally in the circuit card.

Electronic components 8 are carried by the base circuit card. Circuitry on the card can include read-only storage modules for storage of operational programs or data, and read-write storage modules for use by the external equipment or extension modules to which the card may be connected from time to time. The circuitry can be adapted to provide common base functions to permit support for a variety of extension modules to achieve different desired functions.

Upper cover 4a, and lower cover 4b, are assembled about the circuit module to form jacket 4 as described below. The covers take the general form of flat based rectangular dishes with bent edges forming perimeter walls. The covers shown are essentially mirror versions of each other. Referring to the bottom cover 4b, it may be seen that it has a flat base 12 and upstanding walls 13b along its sides, tabs 14b at the rear end and 29b at the front end.

A portion of the base of each cover is narrowed to form a plate-like extension 15, for protecting connector 3. An insulating layer 16 illustrated may be advantageously incorporated on the interior of each cover to protect internal components.

Figure 5:
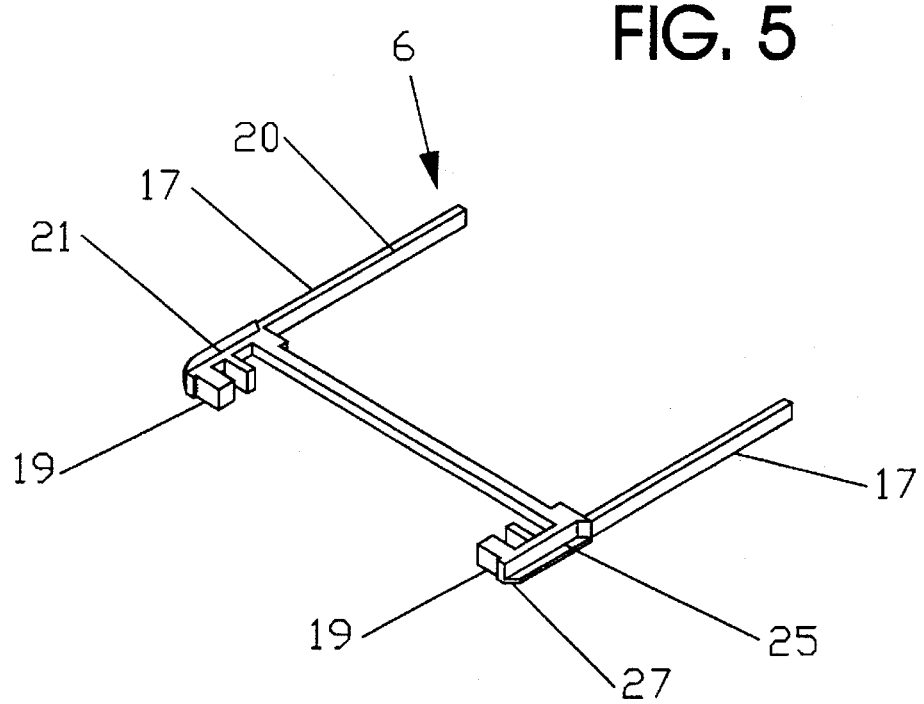
FIG. 5 is a perspective of a perimeter frame of the base card.

The partial perimeter frame 6, which is shown in more detail in FIG. 5, has a number of functions and features. It functions as a carrier for circuit board 7 during the final stages of assembly and testing of the card. It importantly also functions as an internal arbor for locating covers 4a, 4b during assembly to control their alignment for the joining of the covers together. Recessed portions 17 along the sides of the frame, and recesses 19 at the front end of the frame provide this alignment function.

In addition, the top (and likewise the bottom) surface 20 of the frame is recessed below protective edges or curb portions 21 of the edges of the frame. These curbs provide two functions. Curb portions 21 (along the sides of the frame adjacent the position that will be occupied by connector 3), and a similar curb 24 extending along the outer end of connector 3 (see FIG. 4) serve to conceal the unbent edges of covers 4a, 4b from exposure so that the covers can lay below or flush with these frame curbs. If the covers are set below the curbs a degree of protection will be given to artwork present on surfaces of the covers.

Corners 27 in general provide external shock absorbing material to reduce or prevent damage if the card is dropped. The corners also eliminate the need to draw the corners of the covers during their forming stage greatly reducing cost. The covers can therefore be produced by simple cutting and bending techniques that are well known.

Figure 6:
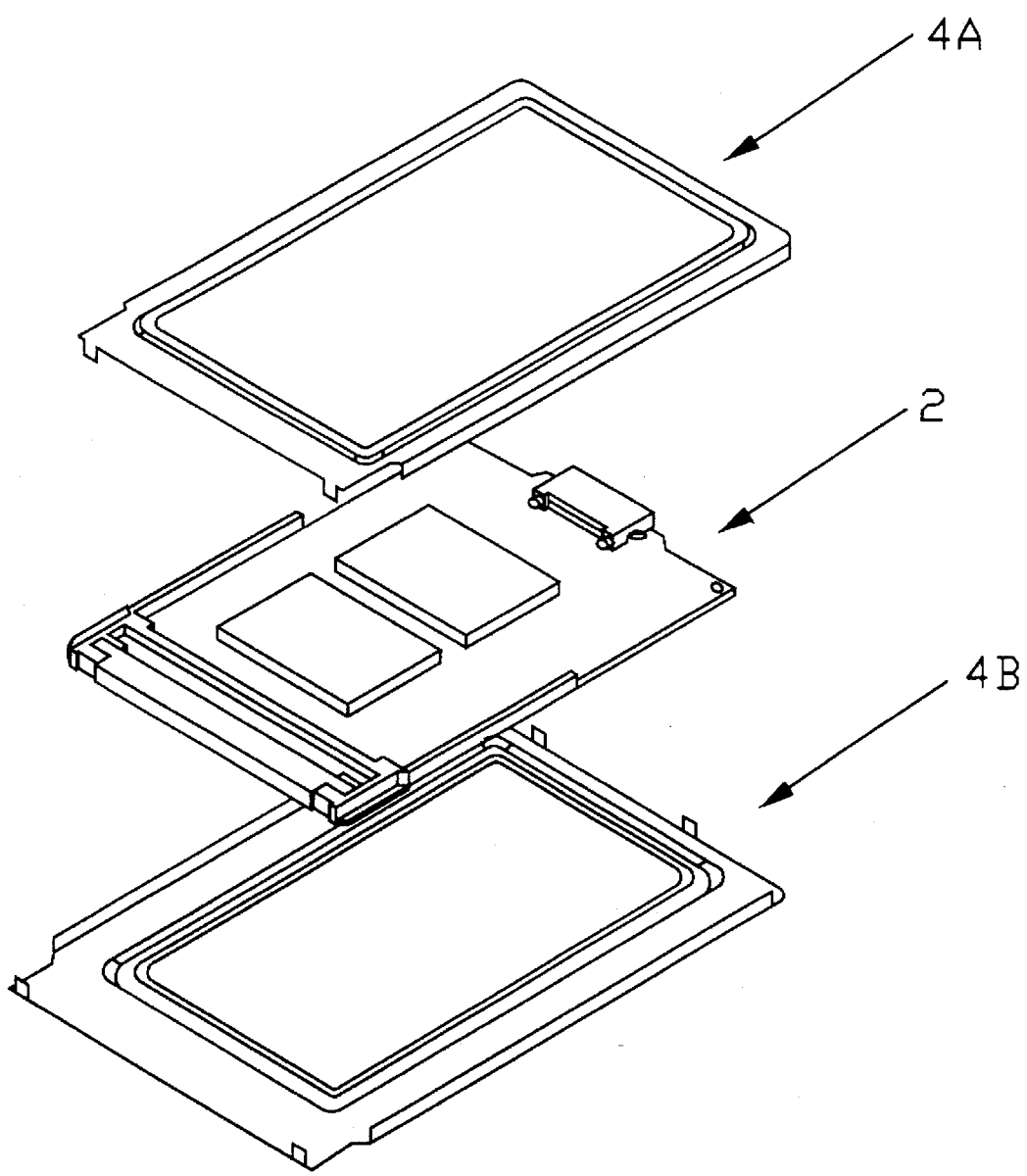
FIG. 6 provides a perspective view of the major parts of the base card arranged relative to each other before assembly.

FIG. 6 shows the covers and circuit module in spaced proximity to each other before assembly.

One process that has been found successful for the assembly of a base card 1 in accordance with the invention herein using components referred to in FIGS. 4 and 5 is as follows:

1. A sub-assembly consisting of circuit board 7, and connector 3 is placed inside the bottom stainless steel cover 4b. The walls 13b, 14b, 29b of the cover extend upwards only half the thickness of the final assembly leaving the upper half of the sub-assembly exposed.
2. The top stainless steel cover 4a is placed over the remaining exposed sub-assembly, its walls 13a, 14a, and 29a resting on the corresponding upstanding walls 13b, 14b, and 29b of the lower cover.
3. This assembly is then placed inside a laser welding fixture which provides a limited clamping force so that the edges of both top and bottom cover remain touching. This fixture also advantageously provides a horizontal rotary action so that all four sides of the assembly can be exposed to a beam from a suitable laser for welding.
4. The laser beam is then activated to weld the edges of the covers on one side. Welds are done under a covering blanket of Argon gas. When the side is done the fixture is rotated and the next side is welded. When all sides are completed the finished welded card 1 is removed.

Laser welding is particularly suitable for joining the covers as the welding beam can be accurately controlled in energy level, pulse rate, beam size; and depth can be accurately maintained to provide a homogeneous joint 28 without penetrating beyond the stainless steel cover thickness, thus preventing damage to the plastic frame while achieving complete fusion of all abutting wall edges. As laser welding and apparatus for achieving it are well known no additional details will be provided for the welding process or apparatus.

The welding operation produces a one-piece sheet metal jacket of substantial rigidity which girds the frame and protects its internal components.

While laser welding has been found suitable for the stainless steel described above, other joining techniques capable of producing strong continuous or homogeneous fusion such as brazing may be satisfactory depending on the materials selected.

In the rectangular form depicted the jacket essentially takes the shape of a flattened boxbeam.

Referring to FIG. 3 it can be seen that upper and lower portions of the jacket extend as plates 15 to cover opposite sides of the connector. The ends of the extension plates 15 are joined together by straps 29 set in recesses of connector 3 to maintain the integrity and strength of the jacket and card.

As may be seen the extension plates 15 are somewhat narrower than the rest of the jacket to allow for projection of portions of the perimeter frame in which polarization grooves 25 have been formed to assure correct insertion of the card in cooperative external equipment.

The embodiment described above provides a durable base card that can be assembled without adhesive being required on the frame or component parts to acquire strength. This has the advantage of reducing the stresses that can be exerted on the circuit board or its components which could otherwise contribute to deterioration of electrical joints and components. In addition, as no adhesive is present, the effect of heat and humidity on adhesive do not become limiting factors on card durability.

Figure 7:
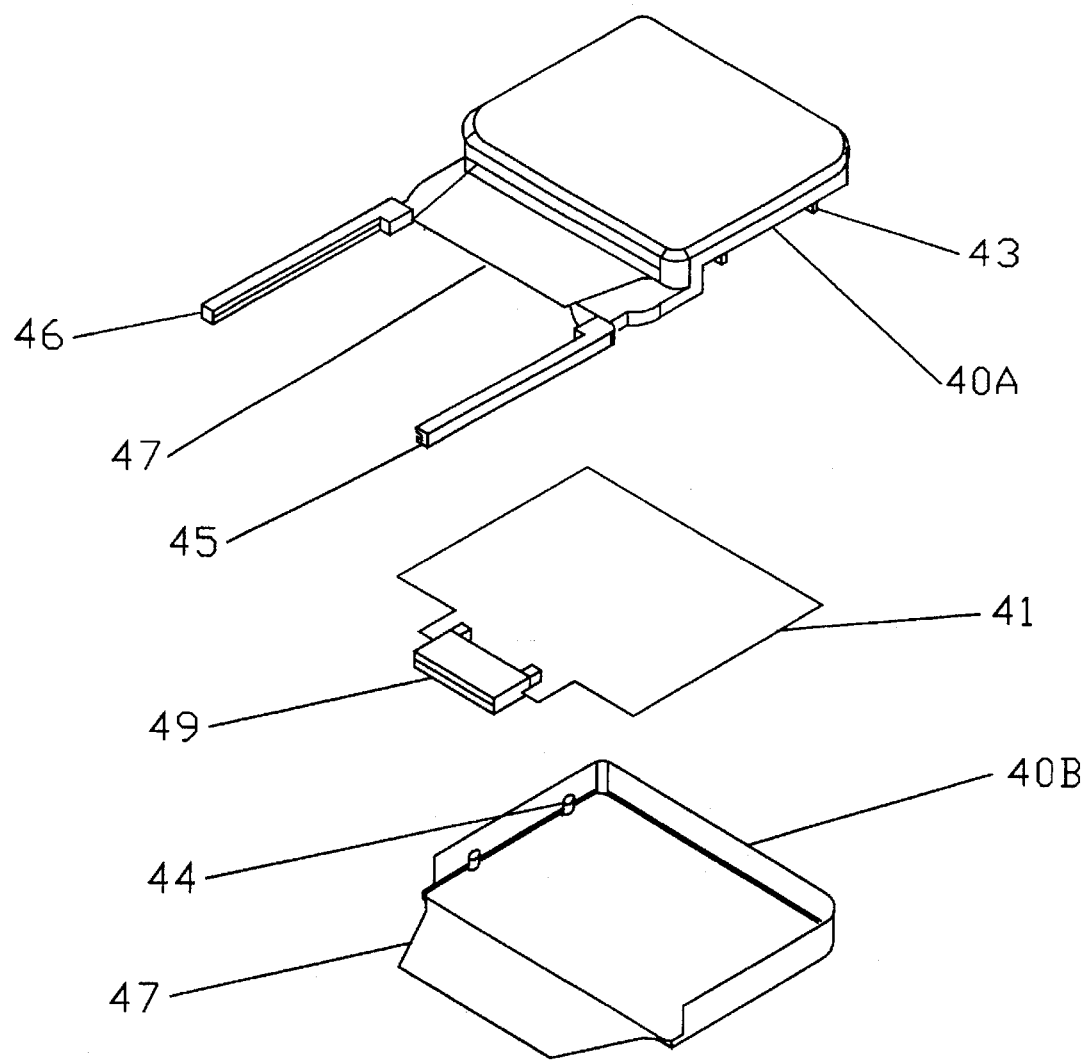
FIG. 7 provides a perspective view of the extension module disassembled to show the upper and lower portions of the module shell and the circuit card that is enclosed between them.

Referring to FIGS. 1, 2, and 7 a preferred embodiment of the extension module of the invention will be described. Referring to FIG. 2 the base card 1 and extension module 40 are shown in proximity to each other prior to interconnection. Module 40 is composed of an upper housing shell 40a and a lower housing shell 40b which may be connected together by means of extension locks 43 which engage the inner edges of 40b in known fashion. Supporting fingers 45 are formed integrally with housing shell 40a in this example. Extension circuit board 41 is designed to be disposed between the housings and expose electrical connector 49 between supporting fingers 45 when so disposed. Card standoffs 44 within the housings serve to support extension circuit card as is well understood in the field.

A longitudinal groove 46 is provided on each of the inwardly opposing faces of the supporting fingers 45 for purposes of slidable engagement to embrace or receive the exposed sides (or edges) 48 of the circuit board 7 when slid within the base card. The supporting fingers can be polarized by formation or displacement of the groove on the fingers so that inverted insertion in the base card can be prevented. A spring loaded latch pin 51 having a camming front face 52 is disposed to inwardly of each support finger 45, to engage corresponding tabs 14 of said base card 1 when support fingers 45 are fully inserted into card 1. This is well known in the field and so will not be discussed further. Upper and lower extension lips 47 on the module serve to shield the upper and lower sides of connector 49 when the extension module is not connected with the base card, and serve to embrace a portion of the top and bottom covering of the base card when fully connected.

Supporting connector fingers 45 may be cast integrally with housing 40a from a variety of suitable materials such as alloys of aluminum, zinc, magnesium, or Thermosat plastic, or plastic composites such as graphite reinforced composites. Electrostatic shielding properties of materials used for the housings 40a, and b, and fingers 45 may require consideration depending on the circuitry to be used. It is possible to form the supporting fingers separately and secure them to the housing in various fashions, however it is more convenient for manufacturing to form them integrally with the extension housing casting.

As may be seen from FIG. 2b the unsupported side edges 48 of circuit board 7 are exposed to view inside apertures 50 located at the outer ends of the rear edge of the base card. The spacing between the circuit card side edges 48 and the corresponding inside portions of the jacket edges adjacent these circuit card side edges essentially define socket-like passages into which supporting fingers 45 may be inserted to be embraced by the inside surfaces of the jacket, and by the edges 48 of the circuit board in this embodiment. Support fingers 45 are configured to provide a tight fit within said jacket so that when fully inserted they provide a rigid connection between extension module and base card forming in essence an integral extended circuit card.

A tandem extended circuit card composed of the base and extension module can be supplied to the end user already assembled or in two sections for user assembly. To assemble the structure the user merely inserts the support fingers 45 of extension module 40 into apertures 50 of base card 1 and pushes the two parts together until latch pin 51 engage the corresponding tabs 14 in base card 1. As they are pushed together grooves 46 in fingers 45 embrace the unsupported edges 48 of circuit board 7 of the base card to support the board, while the outer surfaces of fingers 45 are themselves embraced tightly by the inner surfaces of the jacket of the base card when the base and extension module are pushed fully together latch pins 51 lock the base card 1 and extension module together, and electrical connector 49 of the extension module will mate with the corresponding connector 42 of the base card and the covering lips 47 will embrace or lie along side the top and bottom surfaces of the base card as indicated in FIG. 1. The assembly will at this point be complete and have formed a strong integral circuit card structure permitting its use.

It will be appreciated that other variations of the above embodiments are included in the invention herein.

While the preferred embodiment of the invention described is in reference to PCMCIA conforming cards, other types of circuit cards of differing sizes are contemplated by the invention herein.

What is claimed is:

1. A base circuit card for use with an extension module having paired support fingers and an electrical connector for connection with said base circuit card, comprising:
   (a) a circuit module including,
      (i) a partial perimeter frame,
      (ii) a circuit component circuit board carried at its edges by said frame, said frame leaving the rearward portion of the transverse edges of said board exposed,
      (iii) a first electrical connector disposed at the front end of said frame and being attached electrically to said circuit board,
      (iv) a second electrical connector disposed at the rear end of said circuit module and being attached electrically to said circuit board,
   (b) a protective sheet metal covering closely girding said perimeter frame and substantially enclosing said circuit module in an one-piece substantially rigid jacket;
   (c) an opening in the front end of said jacket coinciding with said first electrical connector to expose a portion of said electrical connector for connection to external equipment,
   (d) an opening in the rearward end of said jacket coinciding with said second electrical connector to expose a portion of said electrical connector for connection to an extension module,
   (e) paired openings at the ends of the rearward end of said jacket to cooperate with the support fingers of the extension module,
   (f) the exposed side edges of said circuit board being spaced from the interior faces of the side edges of said jacket to form a socket-like structure between the edges of the circuit board and the interior of the jacket for embracing receipt of support fingers of said extension module.

* * * * *